(12) United States Patent
Wun et al.

(10) Patent No.: US 10,582,591 B2
(45) Date of Patent: Mar. 3, 2020

(54) DEVICE WITH A MID-FRAME STRUCTURE AND REVERSE DRAFT

(71) Applicant: Rakuten Kobo Inc., Toronto (CA)

(72) Inventors: Archer Wun, Maple (CA); Anna Buechin, Toronto (CA); James Wu, Newmarket (CA); Ernesto Salas, Toronto (CA)

(73) Assignee: RAKUTEN KOBO INC., Toronto (CA)

( * ) Notice: Subject to any disclaimer, the term of this patent is extended or adjusted under 35 U.S.C. 154(b) by 0 days.

(21) Appl. No.: 16/421,490

(22) Filed: May 24, 2019

(65) Prior Publication Data

US 2019/0281684 A1 Sep. 12, 2019

Related U.S. Application Data

(63) Continuation of application No. 16/113,667, filed on Aug. 27, 2018, now Pat. No. 10,342,096, which is a
(Continued)

(51) Int. Cl.
*H05B 37/02* (2006.01)
*H04M 1/18* (2006.01)
(Continued)

(52) U.S. Cl.
CPC .......... *H05B 37/0218* (2013.01); *A45C 11/00* (2013.01); *A45C 13/1069* (2013.01);
(Continued)

(58) Field of Classification Search
CPC combination set(s) only.
See application file for complete search history.

(56) References Cited

U.S. PATENT DOCUMENTS 5,663,748 A 9/1997 Huffman et al.
5,697,793 A 12/1997 Huffman et al.
(Continued)

OTHER PUBLICATIONS

DSM, "Make Magic with Plastic: Smaller, Stronger Smartphone Frames", URL: http://www.dsm.com/markets/electrical-electronics/en US/electronics/mobile/frame.html1 Page total, (Dec. 26, 2015).
(Continued)

*Primary Examiner* — Lisa Lea-Edmonds
(74) *Attorney, Agent, or Firm* — Xsensus LLP

(57) ABSTRACT

An electronic reading device includes a mid-frame structure such that the mid-frame structure can include a reverse draft. A reverse draft corresponds to a back of the electronic reading device being a predetermined amount wider than a front of the electronic reading device. Additionally, a co-molded mid-frame stiffener provides a predetermined rigidity of the electronic reading device. The electronic reading device also includes a display integrated with the front of the mid-frame structure, wherein a space between the display and the mid-frame structure includes one or more electronic reading device components. Similarly, a back cover is integrated with the back of the mid-frame structure, wherein a space between the back cover and the mid-frame structure includes additional electronic reading device components.

20 Claims, 13 Drawing Sheets

Related U.S. Application Data continuation of application No. 15/678,997, filed on Aug. 16, 2017, now Pat. No. 10,082,828.

(60) Provisional application No. 62/375,745, filed on Aug. 16, 2016.

(51) Int. Cl.

| | | |
|---|---|---|
| *G09G 3/34* | (2006.01) | |
| *A45C 11/00* | (2006.01) | |
| *A45C 13/10* | (2006.01) | |
| *A45F 5/00* | (2006.01) | |
| *F21V 3/00* | (2015.01) | |
| *F21V 23/00* | (2015.01) | |
| *F21V 33/00* | (2006.01) | |
| *G02F 1/1333* | (2006.01) | |
| *G06F 1/16* | (2006.01) | |
| *G06F 1/20* | (2006.01) | |
| *G06F 1/3296* | (2019.01) | |
| *G09G 5/02* | (2006.01) | |
| *G09G 5/10* | (2006.01) | |
| *H01H 13/83* | (2006.01) | |
| *H01Q 1/22* | (2006.01) | |
| *H04M 1/02* | (2006.01) | |
| *H04M 1/04* | (2006.01) | |
| *H05B 33/08* | (2006.01) | |
| *H05K 5/00* | (2006.01) | |
| *H05K 7/14* | (2006.01) | |
| *H05K 7/18* | (2006.01) | |
| *F21Y 115/10* | (2016.01) | |
| *F21W 111/10* | (2006.01) | |
| *G06F 3/041* | (2006.01) | |
| *G06F 3/0484* | (2013.01) | |
| *G06F 3/0488* | (2013.01) | |

(52) U.S. Cl.
CPC ............ *A45F 5/00* (2013.01); *F21V 3/00* (2013.01); *F21V 23/003* (2013.01); *F21V 33/0056* (2013.01); *G02F 1/133308* (2013.01); *G06F 1/1626* (2013.01); *G06F 1/1632* (2013.01); *G06F 1/1698* (2013.01); *G06F 1/203* (2013.01); *G06F 1/3296* (2013.01); *G09G 3/3406* (2013.01); *G09G 3/3413* (2013.01); *G09G 5/02* (2013.01); *G09G 5/10* (2013.01); *H01H 13/83* (2013.01); *H01Q 1/22* (2013.01); *H04M 1/0279* (2013.01); *H04M 1/04* (2013.01); *H04M 1/185* (2013.01); *H05B 33/0857* (2013.01); *H05B 33/0863* (2013.01); *H05B 33/0872* (2013.01); *H05B 37/0281* (2013.01); *H05K 5/0017* (2013.01); *H05K 7/1417* (2013.01); *H05K 7/18* (2013.01); *A45C 2011/002* (2013.01); *A45C 2011/003* (2013.01); *A45C 2200/15* (2013.01); *A45F 2200/0516* (2013.01); *F21W 2111/10* (2013.01); *F21Y 2115/10* (2016.08); *G06F 3/041* (2013.01); *G06F 3/0488* (2013.01); *G06F 3/04847* (2013.01); *G06F 2200/1633* (2013.01); *G06F 2200/1634* (2013.01); *G09G 2320/0626* (2013.01); *G09G 2320/0666* (2013.01); *G09G 2320/08* (2013.01); *G09G 2354/00* (2013.01); *G09G 2360/141* (2013.01); *G09G 2360/144* (2013.01); *G09G 2360/16* (2013.01); *G09G 2380/14* (2013.01); *H04M 1/0214* (2013.01); *H04M 1/0245* (2013.01)

(56) References Cited

U.S. PATENT DOCUMENTS

| | | | |
|---|---|---|---|
| 5,959,833 A * | 9/1999 | Youens | G06F 1/1616 |
| | | | 361/679.27 |
| 6,282,088 B1 | 8/2001 | Canova et al. | |
| 6,532,152 B1 | 3/2003 | White et al. | |
| 8,050,018 B2 * | 11/2011 | Takizawa | G06F 1/162 |
| | | | 248/917 |
| 8,218,300 B2 * | 7/2012 | Takizawa | G06F 1/162 |
| | | | 248/917 |
| 8,270,149 B2 | 9/2012 | Hanson et al. | |
| 8,724,316 B2 | 5/2014 | Ou | |
| 8,735,800 B2 | 5/2014 | Andre et al. | |
| 8,786,568 B2 | 7/2014 | Leung et al. | |
| 8,804,332 B2 * | 8/2014 | Canova, Jr. | G06F 1/1626 |
| | | | 361/679.02 |
| 8,886,264 B2 | 11/2014 | Mori | |
| 9,040,850 B2 | 5/2015 | Huang et al. | |
| 9,367,083 B2 * | 6/2016 | Canova, Jr. | G06F 1/1626 |
| 10,082,828 B2 | 9/2018 | Wun et al. | |
| 2001/0038525 A1 | 11/2001 | Urban et al. | |
| 2002/0145571 A1 | 10/2002 | Hulick et al. | |
| 2006/0002072 A1 | 1/2006 | Sutton et al. | |
| 2007/0081318 A1 | 4/2007 | Lynch et al. | |
| 2008/0298083 A1 | 12/2008 | Watson et al. | |
| 2010/0178957 A1 * | 7/2010 | Chen | G06F 1/1626 |
| | | | 455/565 |
| 2012/0162082 A1 | 6/2012 | Mori | |
| 2014/0004555 A1 | 1/2014 | Harrod et al. | |
| 2014/0118985 A1 | 5/2014 | Hassember | |
| 2014/0185234 A1 | 7/2014 | Lee et al. | |
| 2014/0347000 A1 * | 11/2014 | Hamann | G06F 1/189 |
| | | | 320/103 |
| 2015/0168998 A1 * | 6/2015 | Canova, Jr. | G06F 1/1626 |
| | | | 361/679.55 |
| 2015/0253823 A1 | 9/2015 | Han | |
| 2015/0355683 A1 * | 12/2015 | Imana | G06F 1/1692 |
| | | | 345/173 |
| 2018/0052489 A1 | 2/2018 | Wun et al. | |
| 2018/0054913 A1 | 2/2018 | Wun et al. | |

OTHER PUBLICATIONS

Xiaomi, "Stainless Steel Frame Crafted in a 40-Step Process", URL: http://www.mi.com/mena/mi4/process/ 7 Pages total, (Dec. 26, 2015).
Patently Apple, "Apple Wins Patents for Light Sensitive & Transitive Displays", URL: http://www.patentlyapple.com/patently-apple/2011/02/apple-wins-patents-for-light-sensitive-transitive-displays.html 7 Pages total, (Feb. 1, 2011).

* cited by examiner

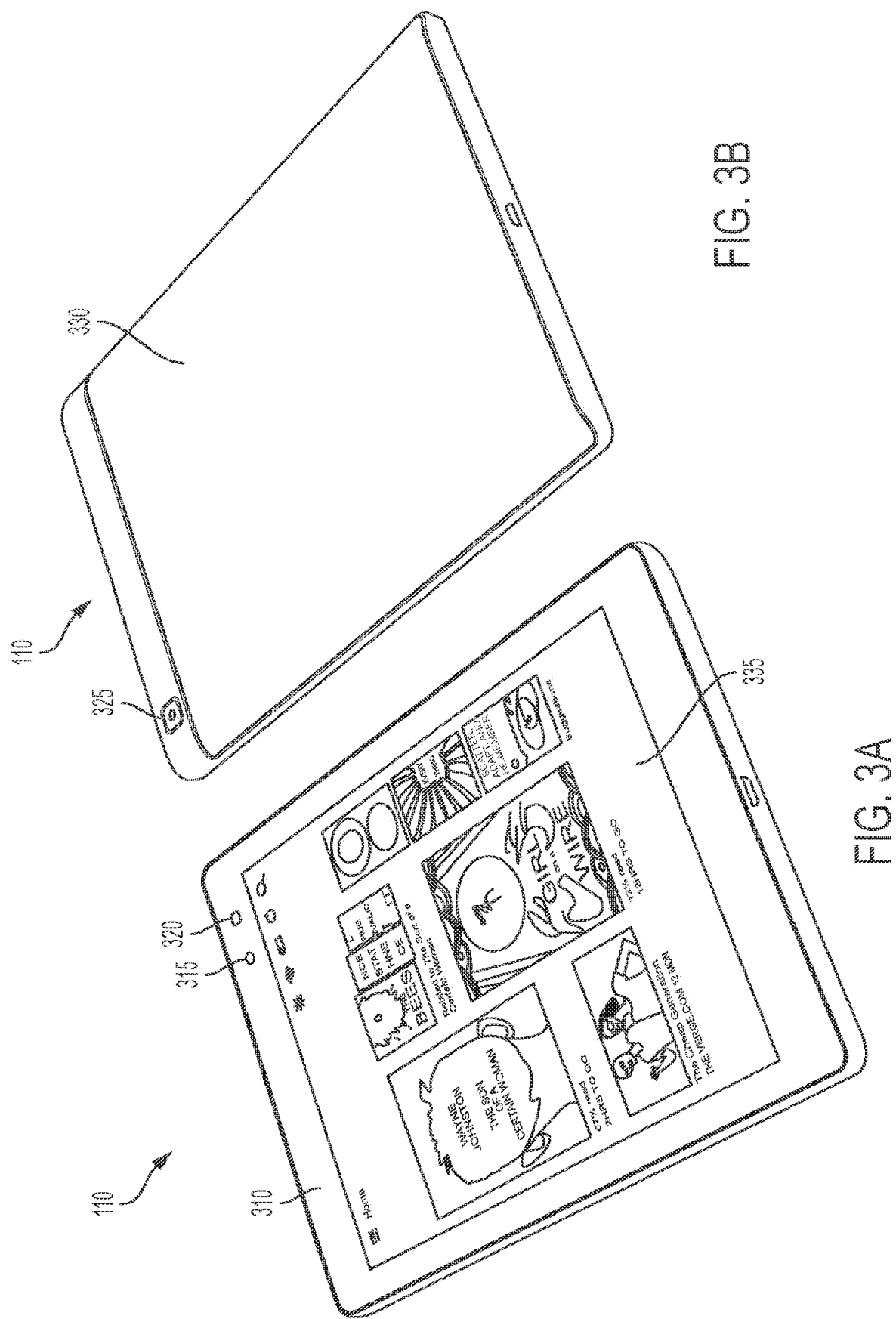

DEVICE WITH A MID-FRAME STRUCTURE AND REVERSE DRAFT

CROSS-REFERENCE TO RELATED APPLICATIONS

This application is a continuation of U.S. application Ser. No. 16/113,667, filed Aug. 27, 2018, which is a continuation of U.S. application Ser. No. 15/678,997, filed Aug. 16, 2017 (now U.S. Pat. No. 10,082,828), which claims the benefit of U.S. Provisional Application No. 62/375,745, filed Aug. 16, 2016, the entire contents of each are incorporated herein by reference. Related applications, U.S. Ser. No. 15/678,671 filed Aug. 16, 2017, 15/678,863 filed on Aug. 16, 2017, 15/678,881 filed on Aug. 16, 2017, 15/678,734 filed on Aug. 16, 2017, 15/678,816 filed on Aug. 16, 2017, and Ser. No. 15/678,971 filed on Aug. 16, 2017 are also herein incorporated by reference in their entirety.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

An electronic reader, also known as an e-reader device, is an electronic personal display that is used for reading electronic books (eBooks), electronic magazines, and other digital content. For example, digital content of an e-book is displayed as alphanumeric characters and/or graphic images on a display of an e-reader such that a user may read the digital content much in the same way as reading the analog content of a printed page in a paper-based book. An e-reader device provides a convenient format to store, transport, and view a large collection of digital content that would otherwise potentially take up a large volume of space in traditional paper format.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to one or more aspects of the disclosed subject matter, an electronic reading device can include a mid-frame structure, the mid-frame structure including a reverse draft corresponding to a back of the electronic reading device being a predetermined amount wider than a front of the electronic reading device, and a co-molded mid-frame stiffener providing a predetermined rigidity of the electronic reading device. Additionally, the electronic reading device can include a display integrated with the front of the mid-frame structure, wherein a space between the display and the mid-frame structure includes a first group of one or more electronic reading device components. Further, the electronic reading device can include a back cover integrated with the back of the mid-frame structure, wherein a space between the back cover and the mid-frame structure includes a second group of one or more electronic reading device components.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 3A depicts a perspective view of a front of an electronic reading device according to one or more aspects of the disclosed subject matter;

FIG. 3B depicts a perspective view of a back of an electronic reading device according to one or more aspects of the disclosed subject matter;

DETAILED DESCRIPTION

Figure 1A:
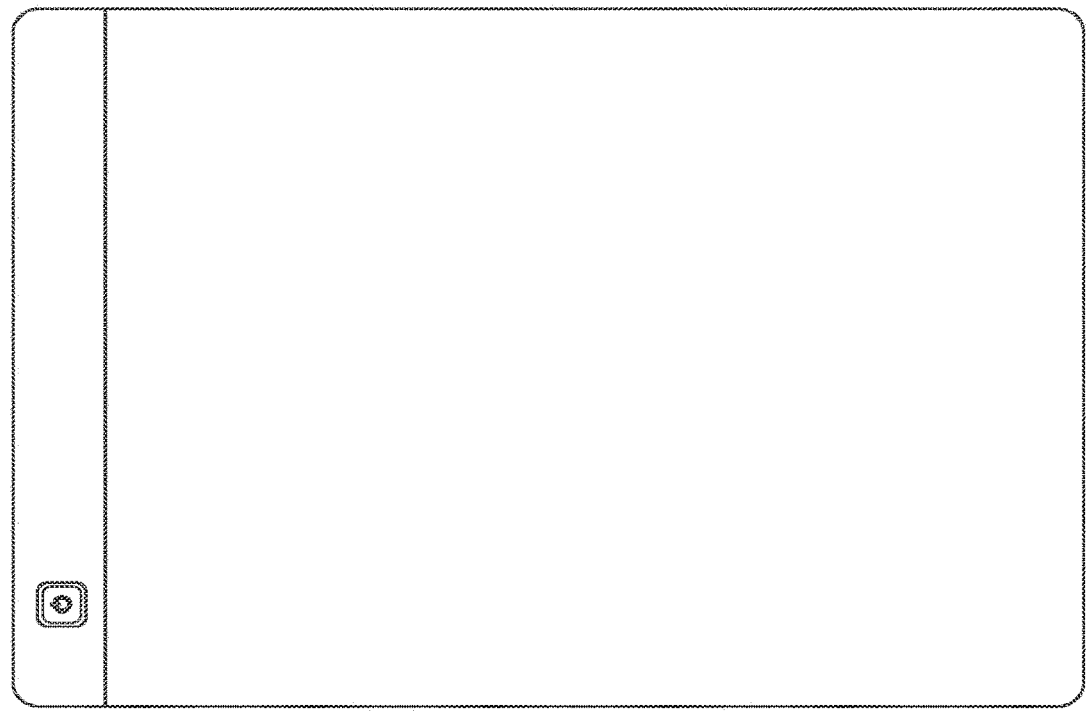
FIG. 1A depicts a perspective view of a front of an electronic reading device according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

Figure 1B:
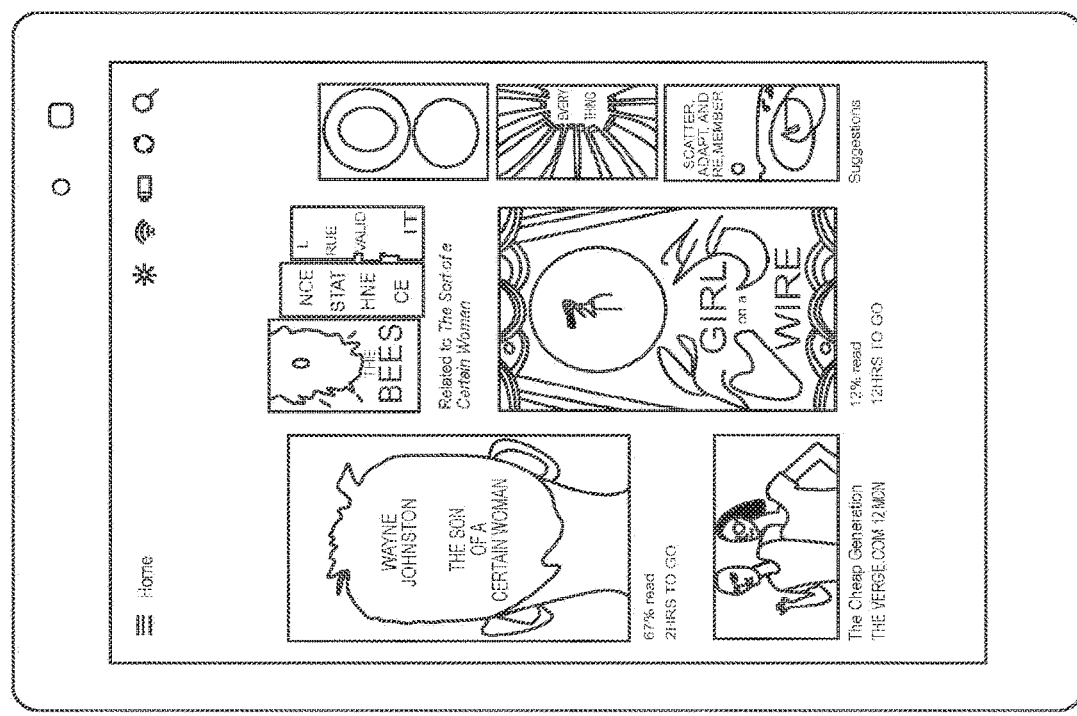
FIG. 1B depicts a perspective view of a back of an electronic reading device according to one or more aspects of the disclosed subject matter.

FIG. 1A-FIG. 1B depicts a perspective view of a front of an electronic reading device 110 and a back of an electronic reading device 110 according to one or more aspects of the disclosed subject matter.

The electronic reading device 110 (also referred to as e-reader 110, electronic reader 110, the device 110, etc.), is an electronic personal display that is used for reading electronic books (eBooks), electronic magazines, and other digital content. For example, digital content of an eBook is displayed as alphanumeric characters and/or graphic images on a display of an e-reader such that a user may read the digital content much in the same way as reading the analog content of a printed page in a paper-based book. An e-reader provides a convenient format to store, transport, and view a large collection of digital content that would otherwise potentially take up a large volume of space in traditional paper format.

In some instances, e-readers are purpose built devices designed especially to perform especially well at displaying readable content. For example, a purpose built e-reader may include a display that reduces glare, performs well in high light conditions, and/or mimics the look of text on actual paper. While such purpose built e-readers may excel at displaying content for a user to read, they may also perform other functions, such as displaying images, emitting audio, recording audio, and web surfing, among others.

There also exists numerous kinds of consumer devices that can receive services and resources from a network service. Such devices can operate applications or provide other functionality that links the device to a particular account of a specific service. For example, e-reader devices typically link to an online bookstore, and media playback devices often include applications which enable the user to access an online media library. In this context, the user accounts can enable the user to receive the full benefit and functionality of the device.

The electronic reading device 110 can enhance electronic reading activity, according to an embodiment. The electronic reading device 110 can include an electronic display device and a network service as further described herein. The network service may include multiple servers and other computing resources that provide various services in connection with one or more applications that are installed on the e-reader device. By way of example, in one implementation, the network service can provide e-book services which communicate with the e-reader device. The e-book services provided through network service can, for example, include services in which e-books are sold, shared, downloaded and/or stored. More generally, the network service can provide various other content services, including content rendering services (e.g., streaming media) or other network-application environments or services.

The e-reader device 110 can correspond to any electronic personal display device on which applications and application resources (e.g., e-books, media files, documents) can be rendered and consumed. For example, the e-reader device 110 can correspond to a tablet or a telephony/messaging device (e.g., smart phone). In one implementation, for example, e-reader device 110 can run an e-reader application that links the device to the network service and enables e-books provided through the service to be viewed and consumed. In another implementation, the e-reader device 110 can run a media playback or streaming application which receives files or streaming data from the network service. By way of example, the e-reader device 110 can be equipped with hardware and software to optimize certain application activities, such as rendering of electronic content (e.g., e-books). For example, the e-reader device 110 can have a tablet like form factor, although variations are possible. In some cases, the e-reader device 110 can also have an E-ink display.

In additional detail, the network service can include a device interface, a resource store and a user account store. The user account store can associate the e-reader device 110 with a user and with an account. The account can also be associated with one or more application resources (e.g., e-books), which can be stored in the resource store. As described further, the user account store can retain metadata for individual accounts to identify resources that have been purchased or made available for consumption for a given account. The e-reader device 110 may be associated with the user account, and multiple devices may be associated with the same account. The e-reader device 110 can store resources (e.g., e-books) that are purchased or otherwise made available to the user of the e-reader device 110, as well as to archive e-books and other digital content items that have been purchased for the user account, but are not stored on the particular computing device.

Figure 2:
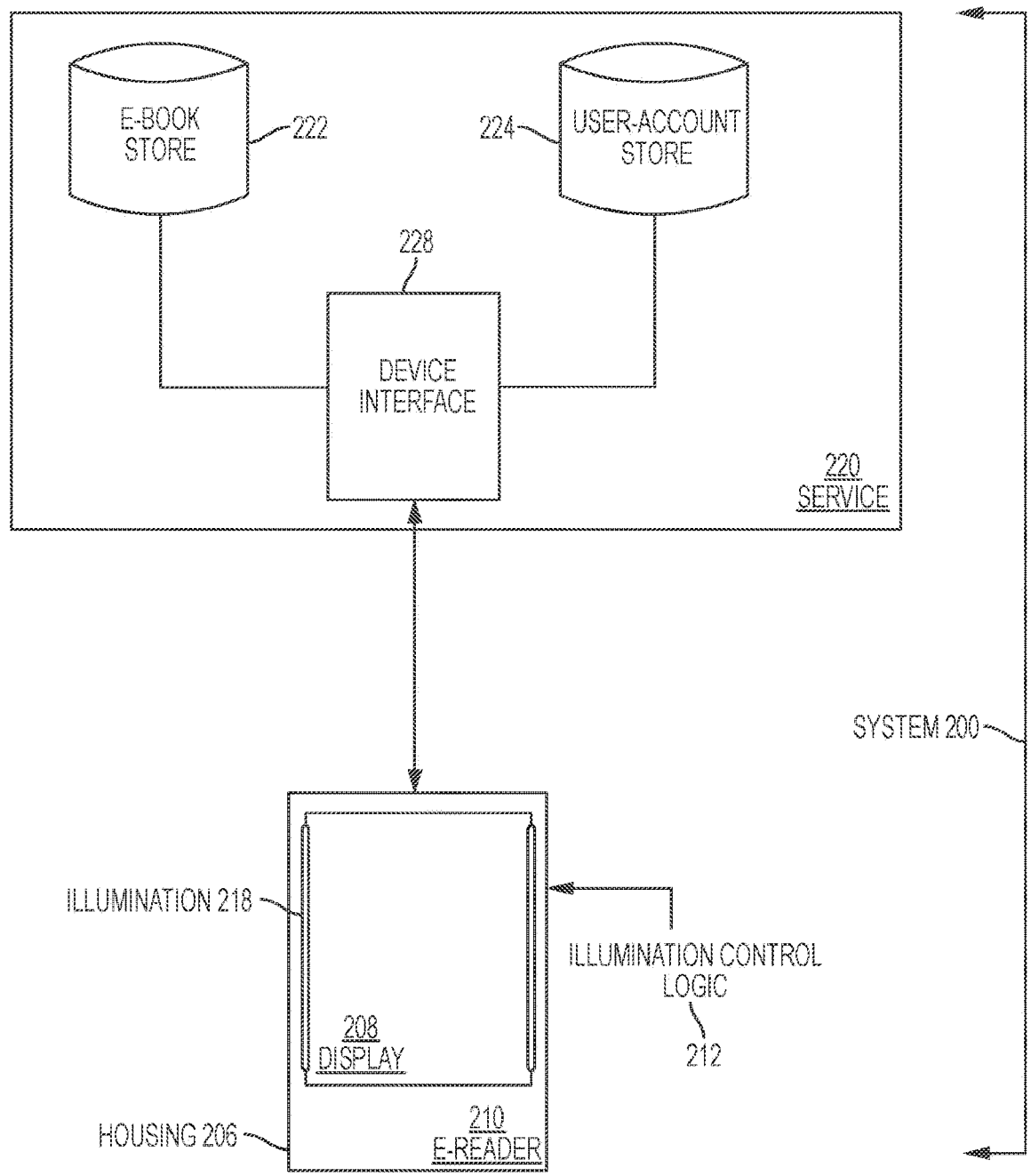
FIG. 2 depicts a system for operating a computing device to enhance electronic reading activity according to one or more aspects of the disclosed subject matter.

FIG. 2 depicts a system for operating a computing device (e.g., the electronic reading device 110) to enhance electronic reading activity according to one or more aspects of the disclosed subject matter. The e-reader device 110 includes a housing 206 that includes a display screen 208 on which text content from selected e-books can be rendered. The e-reader device 110 also includes a separate or independent illumination component 218 for the display screen 208. In some examples provided herein, the illumination component 218 is provided as a front light, which directs light onto the display surface 208 from a housing bezel or thickness. It should be appreciated that the illumination 218 is not limited to the sides of the screen. For example, the illumination 218 can be positioned at the bottom of the screen, as may be seen for the adjustable RBGW front light as further described in U.S. Pat. No. 475,277, which is herein incorporated by reference in its entirety.

The display area 208 can be configured as a touch sensitive component of a display assembly on which input features are provided or are otherwise enabled. By way of example, the input features can include soft buttons or hidden touch regions where the user can transition pages from an e-book, looking words up (using a dictionary function).

According to some examples, the illumination component 218 independently illuminates the display screen 208 in order to create a visual effect. The visual effect can correspond to, for example, illuminating an otherwise non-illuminated screen (such as provided by electronic paper type displays). The illumination can further be provided with characteristics, such as luminosity, color, and and/or other lighting effects.

The e-reader device 110 can include illumination control logic 212 that controls one or more illumination aspects of the illumination component 218. The illumination component 218 may be a front light. As described with examples, the control logic 212 can control one or more of the color, the luminosity, lighting affect (e.g., blinking or modulation), or other illumination characteristic. Furthermore, in some variations, the control logic 212 controls the illumination component 218 in a manner that is responsive to triggers. As described with various examples, the illumination component 218 can be responsive to software-implemented triggers, sensor implemented triggers, and/or hardware component related triggers. Additionally, the illumination component 218 can be responsive to settings and/or input provided by a user through interaction with the-reader device 110. As described with examples, the control logic 212 controls the lighting aspects of the illumination component 218 while the display screen 208 is used to render content, such as pages of an e-book. In this way, the illumination component 218 can generate ambience, illumination environment, and/or status information independently of content displayed on the display screen 208.

In one implementation, the illumination component 218 is provided in the form of light emitting diodes (LEDs) or other discrete light sources that are disposed in a housing 206 of the e-reader device 110. The front light 218 can be programmatically controllable to modulate in color, luminosity and/ or affect. The orientation of the illumination component 218 directs light onto the display screen 208 independent of content rendered through the display screen. As shown with examples of FIG. 7B and FIG. 7C, the light sources that comprise the illumination component 218 can be disposed in a bezel of the housing 206 so as to cast light on to the display screen 208.

The electronic reading device can include a front light, and more specifically an adjustable RGBW front light. Various hardware components, as further described herein, may contribute to the operation of the electronic reading device. For example, the various hardware components may receive instructions from the illumination control logic 212. Additionally, the electronic reading device can have a range of dimensions to incorporate the various hardware components. However, the depth of the electronic reading device can be less than seven millimeters. More specifically, the depth of the electronic reading device can be 6.99 millimeters due at least in part to the structural design as further described herein.

FIG. 3A depicts a perspective view of a front 310 of the electronic reading device 110 according to one or more aspects of the disclosed subject matter. The front 310 of the electronic reading device 110 can include a display 335. The display 335 can correspond to the display 208 from FIG. 2, for example. The front 310 can also include an ambient light sensor opening 315 and a tri-color status LED 320, as further described herein.

FIG. 3B depicts a perspective view of a back 330 of the electronic reading device 110 according to one or more aspects of the disclosed subject matter. The back of the electronic reading device 110 can include a power/sleep button 325, as further described herein.

Figure 4B:
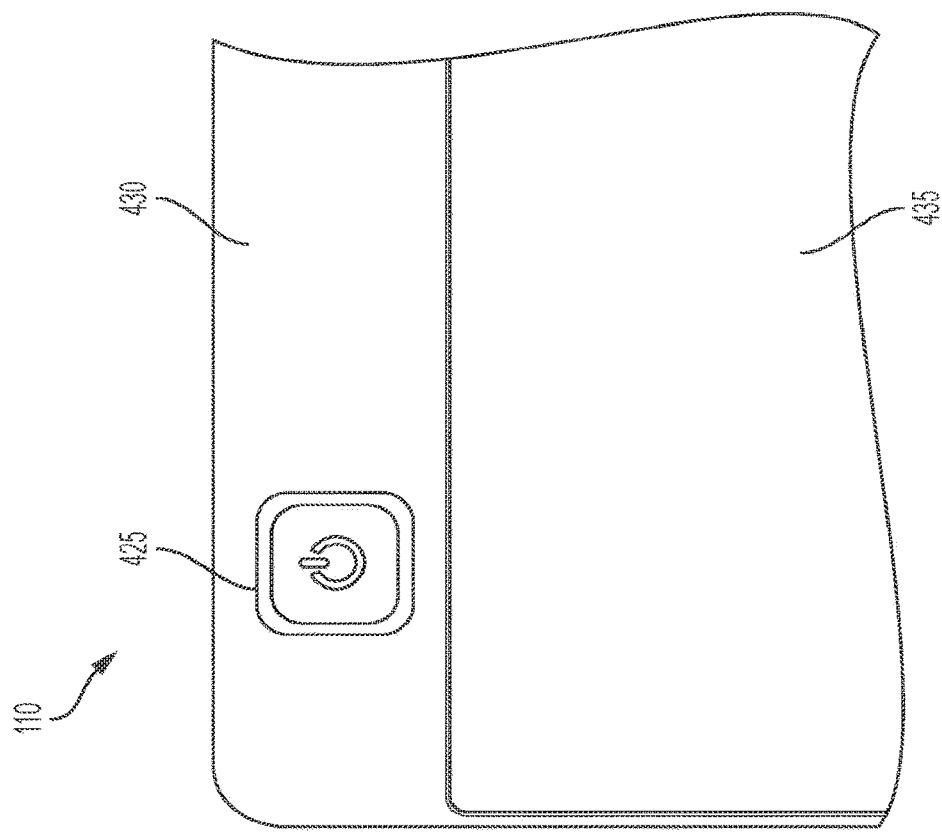
FIG. 4B is a close up view of an upper left corner of a back of an electronic reading device according to one or more aspects of the disclosed subject matter.
Figure 4A:
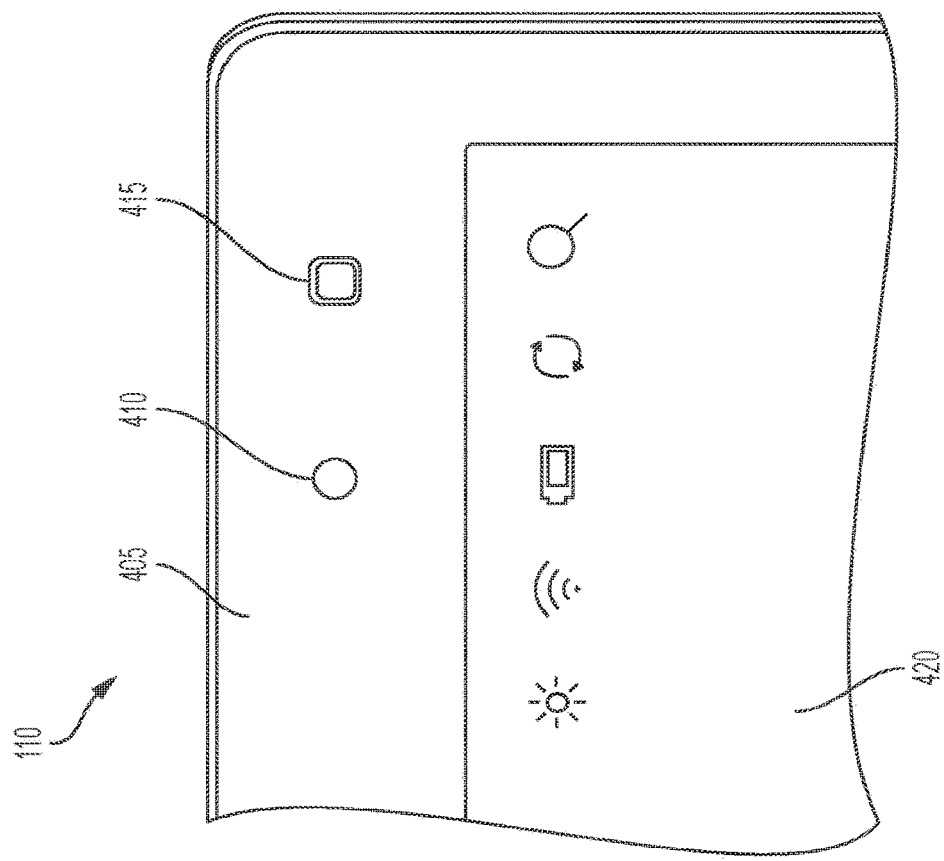
FIG. 4A is a close up view of an upper right corner of a front of an electronic reading device according to one or more aspects of the disclosed subject matter.

FIG. 4A is a close up view of an upper right corner of a front 405 of an electronic reading device 110 according to one or more aspects of the disclosed subject matter. The front 405 can include a display 420 (e.g., display 208 in FIG. 2). The upper right corner of the front 405 of the electronic reading device 110 can include various components including an ambient light sensor opening 410 and a tricolor status LED 415. The ambient light sensor opening 410 can provide an entry point for ambient light to reach an ambient light sensor. The tricolor status LED 415 can be a substantially square shape with rounded corners. Additionally, the tricolor status LED 415 can be a predetermined color. The tricolor status LED 415 can indicate various interactions with the electronic reading device 110.

FIG. 4B is a close up view of an upper left corner of a back of an electronic reading device according to one or more aspects of the disclosed subject matter. The upper left corner of the back 430 of the device 110 can include a power/sleep button 425. The power/sleep button 425 can be recessed and/or a predetermined color. The tricolor status LED 415 of FIG. 4A and the power/sleep button 425 can be the same predetermined color. Additionally, the power/sleep button 425 is a substantially square shape with rounded corners. Further, the tricolor status LED 415 can be in line along the same axis as the power/sleep button 425. The similar shape, color, and position of the tricolor status LED 415 and the power/sleep button 425 can provide various aesthetic and functional advantages. The advantages can include creating an intuitive user experience, as well as providing confidence in the user's interaction with the power/sleep button 425, as an interaction with the power/ sleep button 425 causes an activation of the similarly shaped, colored, and positioned tricolor status LED 415.

The back 430 of the electronic reading device 110 can include a back cover 425. The back cover 425 can include predetermined patterns for various stylistic and aesthetic purposes, as well as for providing grip to assist in holding the electronic reading device 110. The patterns may be laser cut, for example, such that at least a portion of the pattern includes a predetermined depth.

Figure 5B:
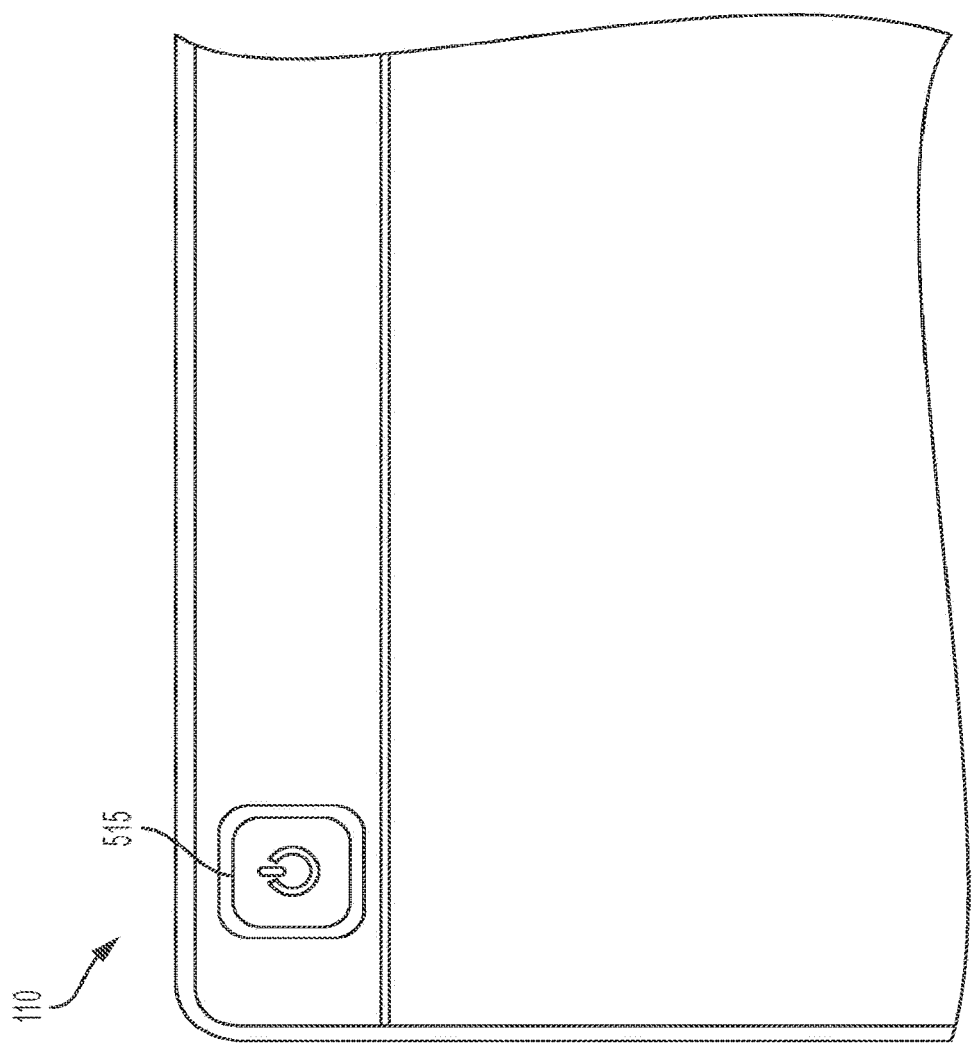
FIG. 5B depicts a perspective view of an upper left corner of a back of an electronic reading device according to one or more aspects of the disclosed subject matter.
Figure 5A:
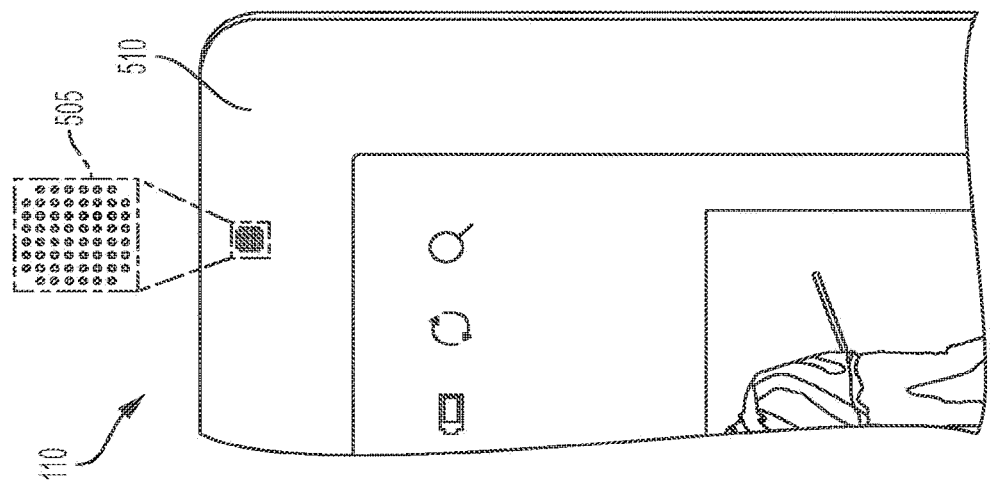
FIG. 5A depicts a perspective view of an upper right corner of a front of an electronic reading device according to one or more aspects of the disclosed subject matter.

FIG. 5A depicts a perspective view of an upper right corner of a front 510 of an electronic reading device 110 according to one or more aspects of the disclosed subject matter. The upper right corner of the front 510 of the electronic reading device 110 can include a plurality of micro laser through holes 505. The plurality of micro laser through holes 505 can be configured to allow a predetermined light (e.g., an LED) to be seen in response to one or more interactions with the electronic reading device 110. Additionally, the plurality of micro laser through holes 505 can be a predetermined number of micro laser through holes 505 in a predetermined positional configuration. The micro laser through holes 505 can be configured to increase consistency of a non-touch area of the front 510 of the device 110, such that the front 510 of the device 110 maintains a predetermined level of visual consistency in the non-touch areas of the front 510 of the device 110. The non-touch sensitive portion of the front 510 can outline the display of the device 110. Further, the micro laser through holes 505 can provide an area through which light is visible in response to one or more interactions with the electronic reading device 110.

The plurality of micro laser through holes 505 can correspond to a predetermined number of micro laser through holes such that the predetermined number of micro laser through holes optimizes the visibility of the light displayed through the micro laser through holes 505 with the predetermined level of visual consistency of the non-touch sensitive portion of the front 510 of the electronic reading device 110. In other words, the light can be visible while the number of micro laser through holes remains low enough to maintain the predetermined level of visual consistency.

Additionally, the plurality of micro laser through holes 505 can include a predetermined positional configuration optimizing the visibility of the light displayed through the micro laser through holes 505 with the predetermined level of visual consistency of the non-touch sensitive portion of the front 510 of the electronic reading device 110. Similarly, the area through which light is visible in response to the one or more predetermined interactions with the electronic reading device 110 can occupy a predetermined amount of space of the non-touch sensitive portion of the electronic reading device 110. The predetermined amount of space of that the micro laser through holes 505 occupy on the non-touch sensitive portion of the electronic reading device 110 can be a square with predetermined dimensions based on the size of the display, for example.

The light displayed through the micro laser through holes 505 can correspond to a predetermined color of light based on the one or more interactions with the electronic reading device. For example, the color of the light can change based on a type of notification (e.g., low battery, download complete, and the like). In other words, any notification of the device can be associated with a color and activated when that notification occurs, for example.

FIG. 5B depicts a perspective view of an upper left corner of a back of the electronic reading device 110 according to one or more aspects of the disclosed subject matter. The back of the electronic reading device 110 can include a power/sleep button 515 (e.g., power/sleep button 425 in FIG. 4B).

Figure 6:
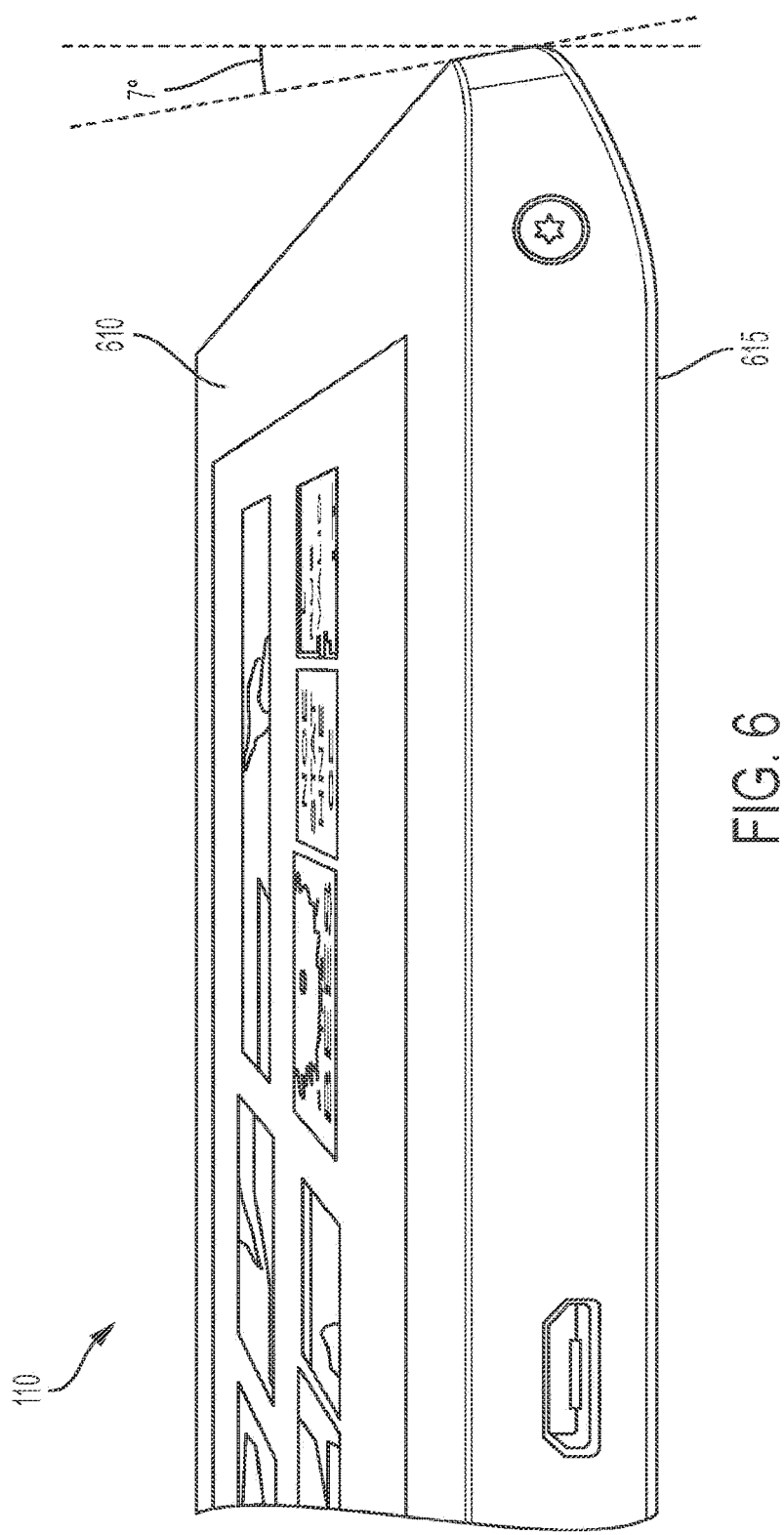
FIG. 6 depicts an electronic reading device including a reverse draft structure according to one or more aspects of the disclosed subject matter.

FIG. 6 depicts an electronic reading device 110 including a reverse draft structure according to one or more aspects of the disclosed subject matter. The reverse draft structure corresponds to a back 615 of the electronic reading device 110 being wider than a front 610 of the electronic reading device 110. More specifically, the reverse draft can be at an angle of seven degrees relative to vertical, the vertical being an axis perpendicular to the front 610 of the device 110. In other words, the back 615 of the device is seven degrees wider than the front 610 of the device 110. The reverse draft allows accessories to attach to the device 110 while remaining flush with the front 610 of the device 110. For example, a protective case for the electronic reading device 110 may be attached such that a section of the protective case that secures the case to the device does not use the face of the device to secure the protective case. To the contrary, the protective case can be secured to the electronic reading device 110 via the reverse draft. Because the back 615 of the device 110 is wider than the front 610 of the device 110, the protective case can be sufficiently secured to the electronic reading device 110 while being flush with the front 610 of the electronic reading device 110 (i.e., the section of the protective case that attaches to the electronic reading device 110 does not exceed a predetermined height above the front 610 of the electronic reading device 110).

Figure 7A:
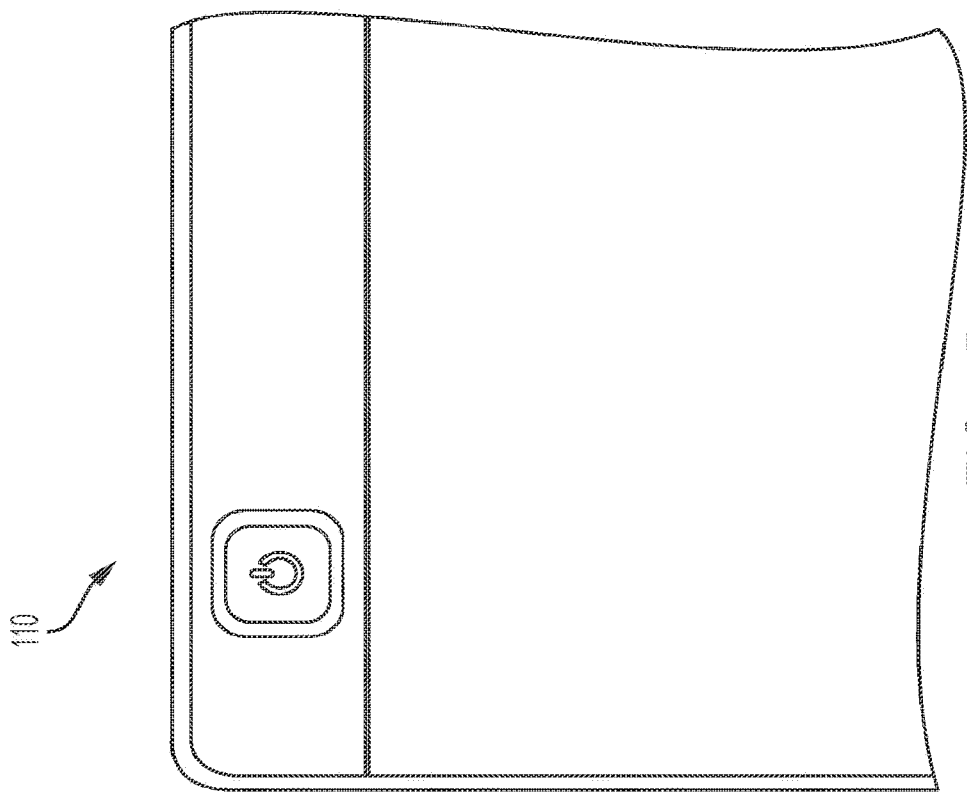
FIG. 7A depicts an exemplary perspective view of an upper right section of an electronic reading device according to one or more aspects of the disclosed subject matter.

FIG. 7A depicts an exemplary perspective view of an upper right section of an electronic reading device 110 according to one or more aspects of the disclosed subject matter.

Figure 7B:
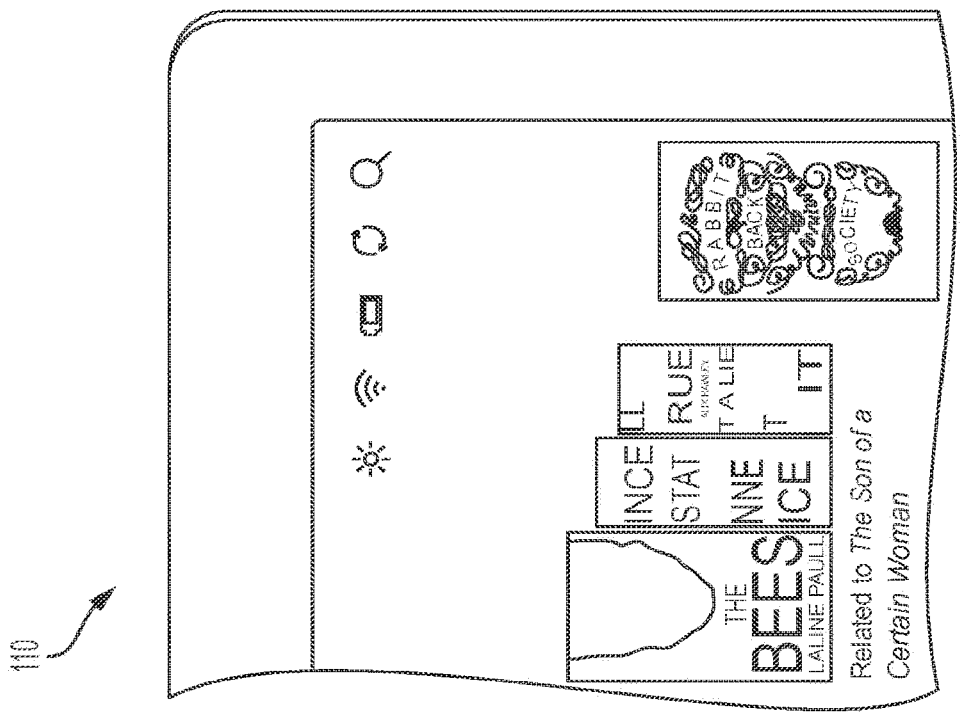
FIG. 7B depicts an exemplary perspective view of an upper left section of an electronic reading device according to one or more aspects of the disclosed subject matter.

FIG. 7B depicts an exemplary perspective view of an upper left section of an electronic reading device 110 according to one or more aspects of the disclosed subject matter.

Figure 8:
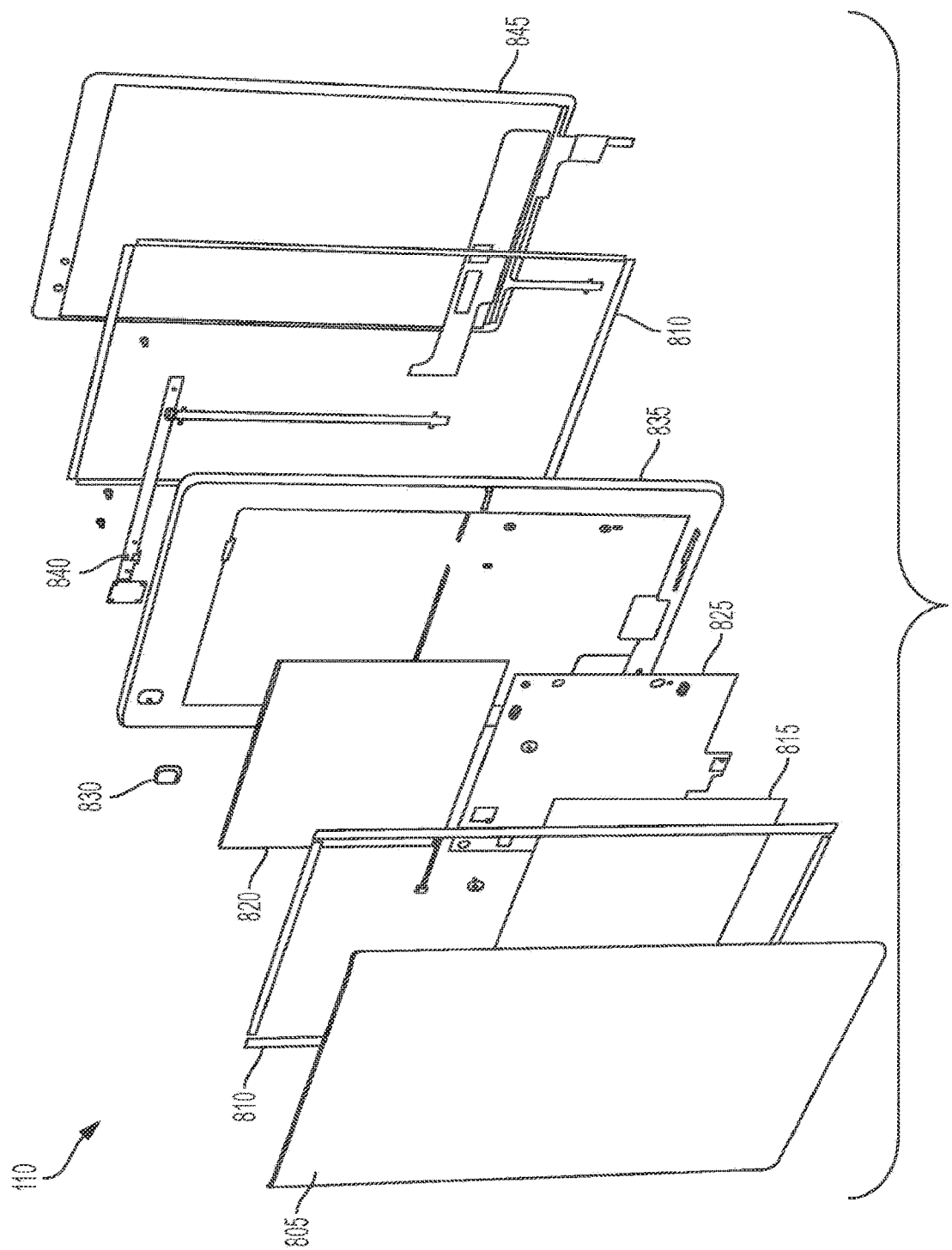
FIG. 8 is an exploded view of an electronic reading device according to one or more aspects of the disclosed subject matter.

FIG. 8 is an exploded view of an electronic reading device 110 according to one or more aspects of the disclosed subject matter. The electronic reading device 110 can include a back cover 805, adhesive tapes 810, Mylar electrostatic discharge (ESD) 815, a battery 820, a main process control block (PCB) 825, a power button 830, a mid-frame 835, a daughter PCB 840, and a display module 845. The display module 845 can include an electronic paper display (EPD), a front light (FL), and a touch panel (TP).

Figure 9:
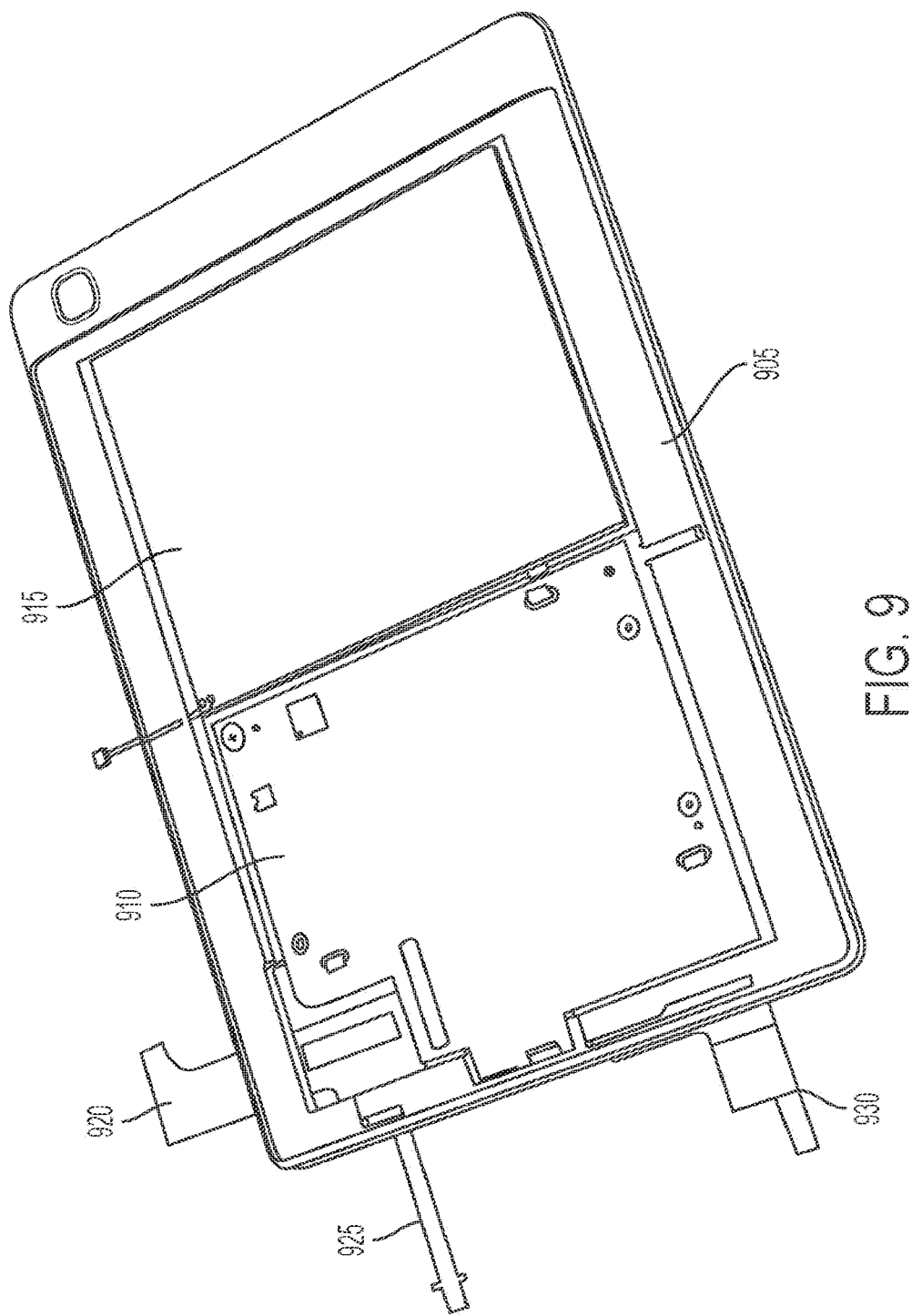
FIG. 9 is a perspective view of a mid-frame component of an electronic reading device including a positional layout of various components integrated into the mid-frame component according to one or more aspects of the disclosed subject matter.

FIG. 9 is a perspective view of a mid-frame component 905 of an electronic reading device 110, for example, including a positional layout of various components integrated into the mid-frame component 905 according to one or more aspects of the disclosed subject matter. The mid-frame component 905 can include the main PCB 910 and the battery 915 secured in the mid-frame component 905. Additionally, the EPD flexible printed circuit (FPC) 920, the front light FPC 925, and the touch panel FPC 930 are integrated into the mid-frame component 905 of the electronic reading device 110. The battery 915 can be positioned toward a top of the electronic reading device 110. The main PCB 910, the EPD FPC 920, the front light FPC, and the touch panel FPC can be positioned toward a bottom end of the electronic reading device, the bottom end being opposite the top end.

Figures 10A, 10B:
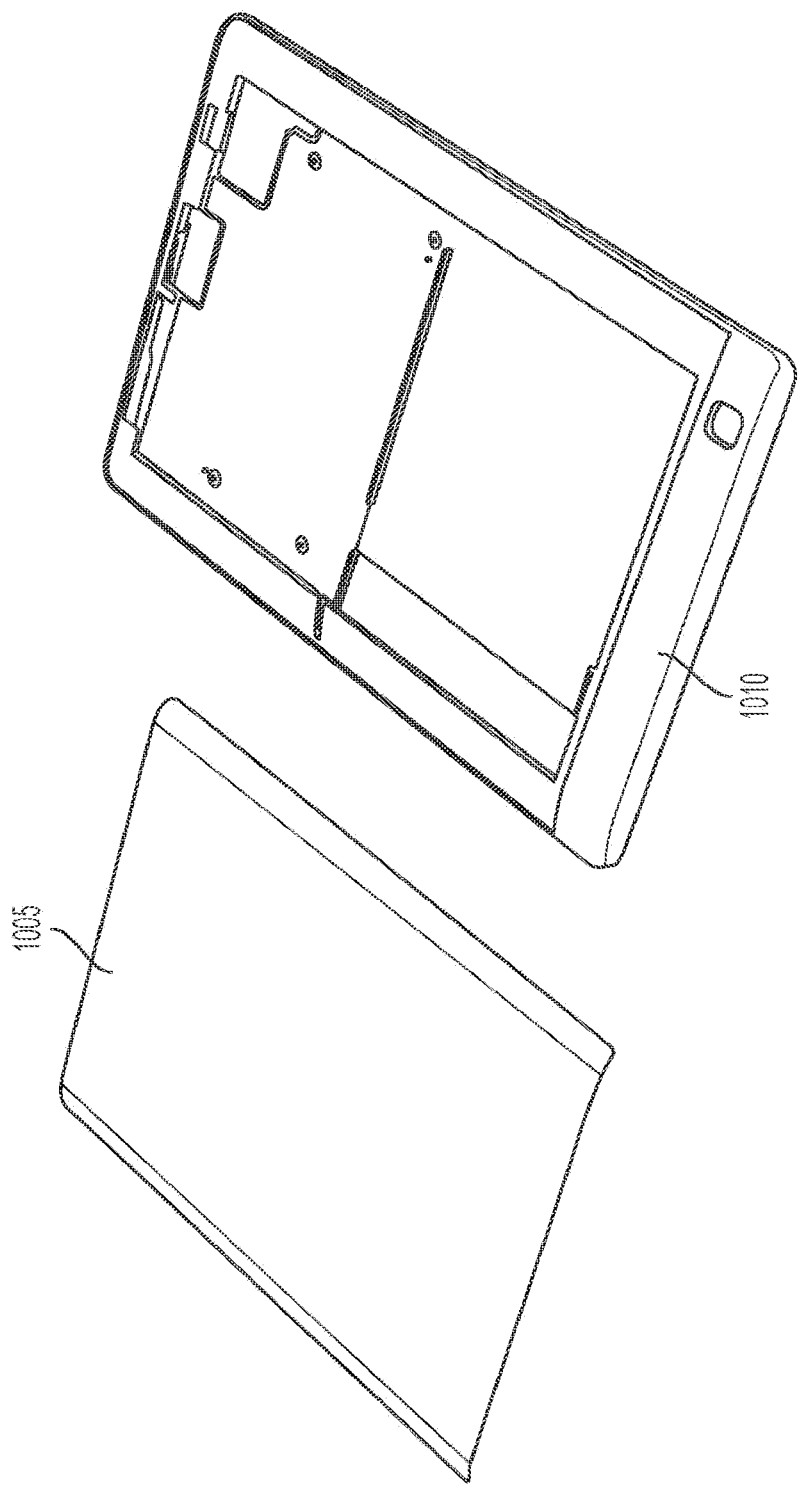
FIG. 10A is a perspective view of a back cover of an electronic reading device according to one or more aspects of the disclosed subject matter.
FIG. 10B is a perspective view of a co-molded mid-frame stiffener according to one or more aspects of the disclosed subject matter.

FIG. 10A is a perspective view of a back cover 1005 of an electronic reading device according to one or more aspects of the disclosed subject matter. The back cover 1005 can include predetermined patterns for various stylistic and aesthetic purposes, as well as for providing grip to assist in holding the electronic reading device 110. The patterns may be laser cut, for example, such that at least a portion of the pattern includes a predetermined depth.

FIG. 10B is a perspective view of a co-molded mid-frame stiffener 1010 according to one or more aspects of the disclosed subject matter. The co-molded mid-frame stiffener can increase rigidity of the electronic reading device. Specifically, a predetermined level of rigidity is advantageous due the thinness of the electronic reading device (6.99 millimeters). For example, the predetermined rigidity can be better than the Bending and Twisting Test requirement. The Bending and Twisting Test requirement can correspond to a Bending Test and a Twisting Test. The Bending Test can correspond to applying a force of 2 kilograms in X and Y directions. The Twisting Test can correspond to applying a force of 2.0 Nm for 1 cycle in a clockwise and anticlockwise direction.

Figure 11B:
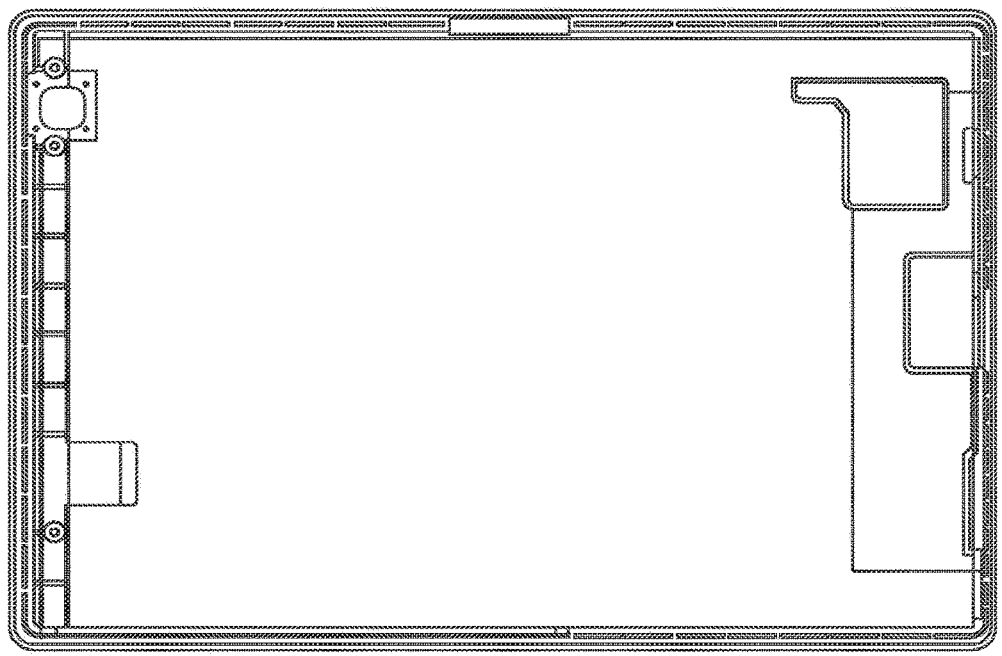
FIG. 11B is a front perspective view of a mid-frame structure according to one or more aspects of the disclosed subject matter.
Figure 11A:
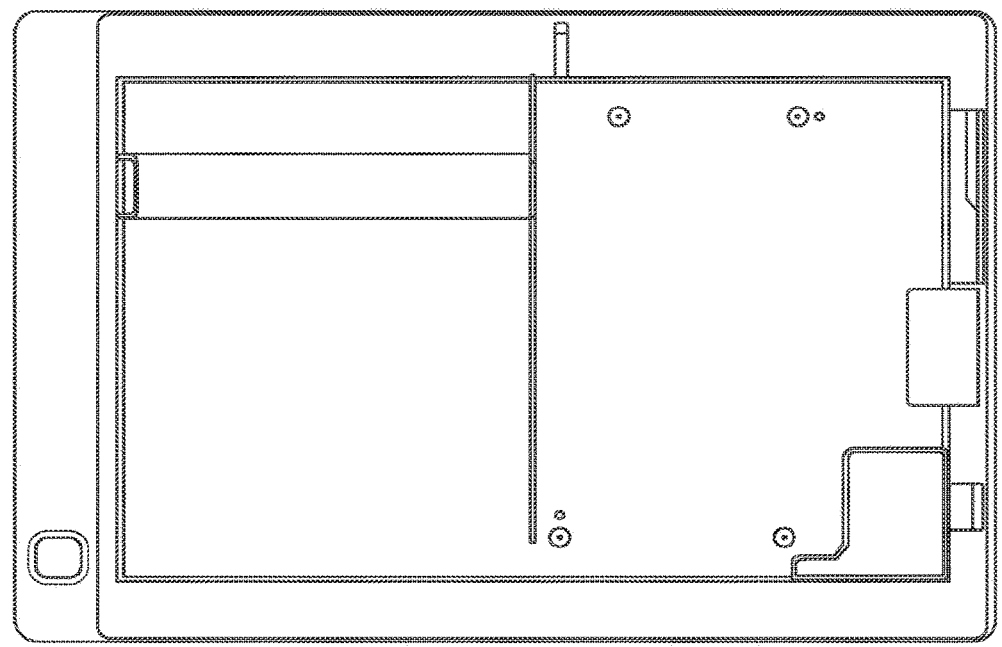
FIG. 11A is a back perspective view of a mid-frame structure according to one or more aspects of the disclosed subject matter.

FIG. 11A is a back perspective view of a mid-frame structure 1105 according to one or more aspects of the disclosed subject matter.

FIG. 11B is a front perspective view of a mid-frame structure 1110 according to one or more aspects of the disclosed subject matter.

Figure 12:
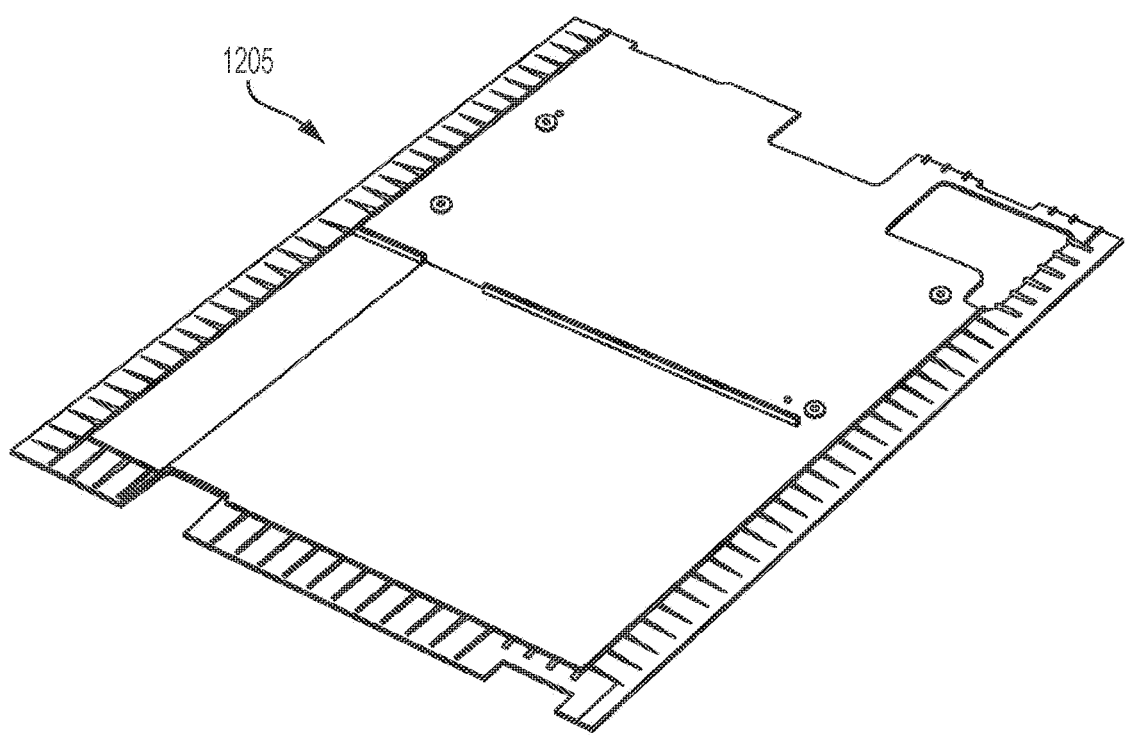
FIG. 12 is a perspective view of an injection molded magnesium stiffener before co-molding according to one or more aspects of the disclosed subject matter.

FIG. 12 is a perspective view of an injection molded magnesium stiffener 1205 before co-molding according to one or more aspects of the disclosed subject matter. The injection molded magnesium stiffener 1205 can be a die-casted magnesium stiffener that can be 1.2 mm thick. Additionally, portions of the stiffener can be thinner (e.g., 0.8 mm) in predetermined areas for running wires (e.g., various FPC described in FIG. 9) and embedding the EPD main FPC (e.g., EPD FPC 920), for example.

Figure 13:
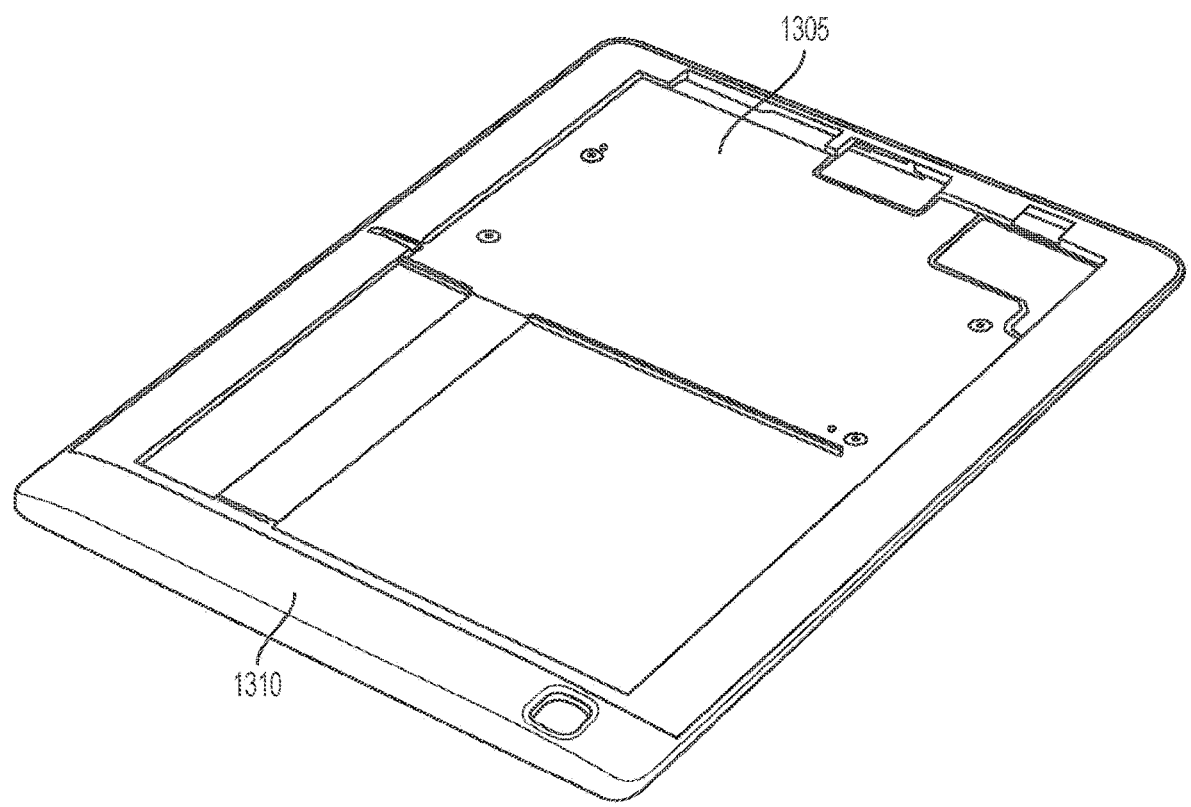
FIG. 13 depicts a perspective view of a mid-frame and magnesium stiffener after co-molding according to one or more aspects of the disclosed subject matter.

FIG. 13 depicts a perspective view of a combined mid-frame/magnesium stiffener after co-molding according to one or more aspects of the disclosed subject matter. The combined mid-frame/magnesium stiffener can include a magnesium stiffener 1305 and a mid-frame 1310.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. An electronic device, comprising:
a mid-frame structure including a reverse draft corresponding to a back of the electronic device being a predetermined amount wider than a front of the electronic device;
a display integrated with the mid-frame structure, wherein a portion of the display includes a plurality of micro laser through holes, wherein a space between the display and the mid-frame structure includes a first group of one or more electronic components, at least one of the electronic components from the first group being configured to provide light through the plurality of micro laser through holes; and
a back cover integrated with the mid-frame structure, wherein a space between the back cover and the mid-frame structure includes a second group of one or more electronic components.

2. The electronic device of claim 1, wherein the plurality of micro laser through holes are configured to
integrate with the front of the electronic device by maintaining a predetermined level of visual consistency of the portion of the display including the micro laser through holes.

3. The electronic device of claim 1, wherein the portion of the display including the micro laser through holes is non-touch sensitive.

4. The electronic device of claim 1, wherein the plurality of micro laser through holes are configured to
provide an area through which light is visible in response to one or more types of interactions with the electronic reading device.

5. The electronic device of claim 1, wherein the plurality of micro laser through holes corresponds to a predetermined number of micro laser through holes optimizing visibility of light displayed through the plurality of micro laser through holes while maintaining a predetermined level of visual consistency of the portion of the display including the micro laser through holes.

6. The electronic device of claim 1, wherein the plurality of micro laser through holes include a predetermined positional configuration optimizing visibility of light displayed through the plurality of micro laser through holes while maintaining a predetermined level of visual consistency of the portion of the display including the micro laser through holes.

7. The electronic device of claim 6, wherein the predetermined positional configuration occupies a predetermined amount of space on the display.

8. The electronic device of claim 4, wherein a predetermined color of light is displayed through the plurality of micro laser through holes corresponding to each of the one or more types of interactions with the electronic device.

9. The electronic device of claim 1, wherein
the reverse draft is at least a 7-degree reverse draft corresponding to the back of the electronic device being at least 7 degrees wider than the front of the electronic device.

10. The electronic device of claim 1, wherein
the electronic device has a depth of less than 7 millimeters.

11. A method for providing an alert area via a plurality of micro laser through holes, comprising:
combining a front cover, a back cover, and a mid-frame disposed between the front cover and the back cover to provide a mid-frame structure, the mid-frame structure including a reverse draft;
integrating the alert area including the plurality of micro laser through holes into a portion of a display, the display being integrated with the mid-frame structure; and
positioning a light source between the display and the mid-frame structure and aligned with the plurality of micro laser through holes, the light source being configured to activate in response to one or more predetermined types of interactions with the electronic reading device.

12. The method of claim 11, further comprising:
integrating the plurality of micro laser through holes with the portion of the display by maintaining a predetermined level of visual consistency of the portion of the display including the micro laser through holes.

13. The method of claim 11, wherein the portion of the display including the micro laser through holes is non-touch sensitive.

14. The method of claim 13, wherein the non-touch sensitive portion outlines the display.

15. The method of claim 11, wherein the plurality of micro laser through holes corresponds to a predetermined number of micro laser through holes optimizing visibility of light displayed through the plurality of micro laser through holes while maintaining a predetermined level of visual consistency of the portion of the display including the micro laser through holes.

16. The method of claim 11, wherein the plurality of micro laser through holes includes a predetermined positional configuration optimizing visibility of light displayed through the plurality of micro laser through holes while maintaining a predetermined level of visual consistency of the portion of the display including the micro laser through holes.

17. The method of claim 16, wherein the predetermined positional configuration occupies a predetermined amount of space on the display.

18. The method of claim 11, further comprising:

displaying a predetermined color of light through the plurality of micro laser through holes corresponding to each of the one or more types of interactions with the electronic device.

19. The method of claim 11, wherein the reverse draft corresponds to a back of the electronic device being a predetermined amount wider than a front of the electronic device.

20. The method of claim 19, wherein the reverse draft is at least a 7-degree reverse draft corresponding to the back of the electronic device being at least 7 degrees wider than the front of the electronic device.

* * * * *